United States Patent
Cheng

(10) Patent No.: US 10,381,518 B2
(45) Date of Patent: Aug. 13, 2019

(54) LIGHT-EMITTING DIODE

(71) Applicant: Wuhan China Star Optoelectronics Technology Co., Ltd., Wuhan (CN)

(72) Inventor: Yan Cheng, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 105 days.

(21) Appl. No.: 15/529,511

(22) PCT Filed: Apr. 10, 2017

(86) PCT No.: PCT/CN2017/079908
§ 371 (c)(1),
(2) Date: May 25, 2017

(87) PCT Pub. No.: WO2018/152939
PCT Pub. Date: Aug. 30, 2018

(65) Prior Publication Data
US 2018/0309028 A1   Oct. 25, 2018

(30) Foreign Application Priority Data
Feb. 22, 2017   (CN) .......................... 2017 1 0098327

(51) Int. Cl.
*H01L 33/00* (2010.01)
*H01L 33/40* (2010.01)
(Continued)

(52) U.S. Cl.
CPC .............. *H01L 33/40* (2013.01); *H01L 33/14* (2013.01); *H01L 33/04* (2013.01); *H01L 33/32* (2013.01); *H01L 33/387* (2013.01)

(58) Field of Classification Search
CPC ................................ H01L 33/40; H01L 33/14
(Continued)

(56) References Cited

U.S. PATENT DOCUMENTS 9,028,071 B2 * 5/2015 Natsumeda .......... G02B 3/0031
257/98
9,287,518 B2 * 3/2016 Lee ..................... H01L 51/5012
(Continued)

FOREIGN PATENT DOCUMENTS

CN      102751407 A      10/2012
CN      102751408 A      10/2012
CN      104966771 A      10/2015

*Primary Examiner* — Tan N Tran
(74) *Attorney, Agent, or Firm* — Leong C. Lei

(57) ABSTRACT

The present invention provides a light-emitting diode. The light-emitting diode includes: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer; and the electron transportation layer is formed of a material comprising graphene so that the excellent electrical conduction property and heat conduction capability of the graphene material help improve the heat dissipation capability and electron transportation capability of the light-emitting diode the electron transportation layer so as to enhance the service life and lighting efficiency of the light-emitting diode.

13 Claims, 2 Drawing Sheets

(51) Int. Cl.
*H01L 33/14* (2010.01)
*H01L 33/04* (2010.01)
*H01L 33/32* (2010.01)
*H01L 33/38* (2010.01)

(58) Field of Classification Search
USPC .................................................. 257/88, 98
See application file for complete search history.

(56) References Cited

U.S. PATENT DOCUMENTS

| | | | |
|---|---|---|---|
| 9,865,768 B2* | 1/2018 | Liu | H01L 51/5209 |
| 2012/0068154 A1* | 3/2012 | Hwang | H01L 51/502 |
| | | | 257/13 |

* cited by examiner

LIGHT-EMITTING DIODE

BACKGROUND OF THE INVENTION

1. Field of the Invention

The present invention relates to the field of display technology, and more particular to a light-emitting diode (LED).

2. The Related Arts

Light-emitting diode (LED) is a semiconductor device that converts electrical current into light. Wavelength of light emitting from a light-emitting diode varies according to the semiconductor material involved, and, more specifically speaking, is varying according to the band gap of the semiconductor material involved. The LED is commonly used as a light source for displays, vehicles, and other applications of illumination. In the LEDs, the amount of heat generated by the light-emitting diodes would directly affect lighting performance and lifespan of a light-emitting diode module, and thus affects the service life of backlighting of a mobile phone display screen or a television display screen. If the heat generated by the light-emitting diode is long kept in the light-emitting diode, then, consequently, dislocation and mismatch would occur in the crystalline structure that makes the light-emitting diode so as to shorten the service life of the light-emitting diode.

Light-emitting diodes that are currently available are classified as a vertical structure and a non-vertical structure (planar structure), in which for a light-emitting diode of the non-vertical structure, an n electrode and a p electrode are respectively located on the same side of an emissive layer, while for a light-emitting diode of the vertical structure, the n electrode and the p electrode are respectively located on upper and lower sides of the emissive layer. Due to constraints on the performance of an electrode transportation layer of a known light-emitting diode, an electrical current flowing between the n electrode and the electron transportation layer does not flow smoothly into the emissive layer, and consequently, the lighting efficiency of the light-emitting diode is affected and heat cannot be well dissipated through the electron transportation layer, leading to an excessively high temperature of the emissive layer. Particularly, for a light-emitting diode of the non-vertical structure, a sapphire substrate provided on one side of a hole transportation layer is of poor thermal conductivity so that, in consideration of heat dissipation, it is necessary for an even larger amount of heat to be dissipated through the electron transportation layer. Thus, upgrading the performance of the electron transportation layer would be of vital influence on the lighting performance and service life of the light-emitting diode.

Graphene is a two-dimensional crystal formed of carbon atoms arranged in a honeycomb form, showing various advantages including high transmission rate, high thermal conductivity, high electron mobility, and low electrical resistivity. The excellent properties make graphene, as well as devices associated therewith, a hot spot of study and research in the fields of physics, chemistry, biology, and material science. Various devices that involve graphene as basic functional units have been made up to date, including field-effect transistors, solar cells, nanometer electrical machines, and transducers.

SUMMARY OF THE INVENTION

An objective of the present invention is to provide a light-emitting diode (LED), which speeds up heat dissipation from the light-emitting diode and enhance lighting efficiency and service life of the light-emitting diode.

To achieve the above objective, the present invention provides a light-emitting diode, which comprises: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of a material comprising graphene.

The light-emitting diode has a non-vertical structure; and the first electrode and the emissive layer are arranged, in a manner of being spaced from each other, on the hole transportation layer; the electron transportation layer is arranged on the emissive layer; and the second electrode is arranged on the electron transportation layer.

Alternatively, the light-emitting diode has a vertical structure and the first electrode, the hole transportation layer, the emissive layer, the electron transportation layer, and the second electrode are sequentially stacked from bottom to top.

The first electrode and the second electrode are formed of a material comprising one of aluminum and copper or a combination thereof.

The hole transportation layer is formed of a material comprising N type doped gallium nitride.

The light-emitting diode further comprises: a substrate and a buffer layer;

wherein the buffer layer is set on and covers the substrate and the hole transportation layer is formed on the buffer layer.

The substrate is a sapphire substrate.

The buffer layer is formed of a material comprising non-doped gallium nitride.

The present invention also provides a light-emitting diode, which comprises: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of a material comprising graphene;

wherein the first electrode and the second electrode are formed of a material comprising one of aluminum and copper or a combination thereof; and wherein the hole transportation layer is formed of a material comprising N type doped gallium nitride.

The efficacy of the present invention is that the present invention provides a light-emitting diode, which comprises: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of a material comprising graphene so that the excellent electrical conduction property and heat conduction capability of the graphene material help improve the heat dissipation capability and electron transportation capability of the light-emitting diode the electron transportation layer so as to enhance the service life and lighting efficiency of the light-emitting diode.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
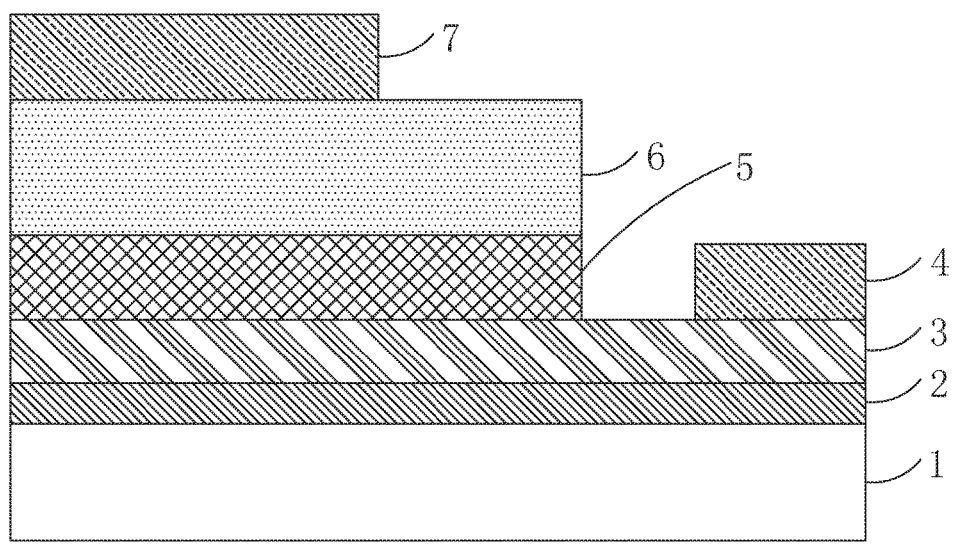
FIG. 1 is a schematic view illustrating a light-emitting diode according to a first embodiment of the present invention.
Figure 2:
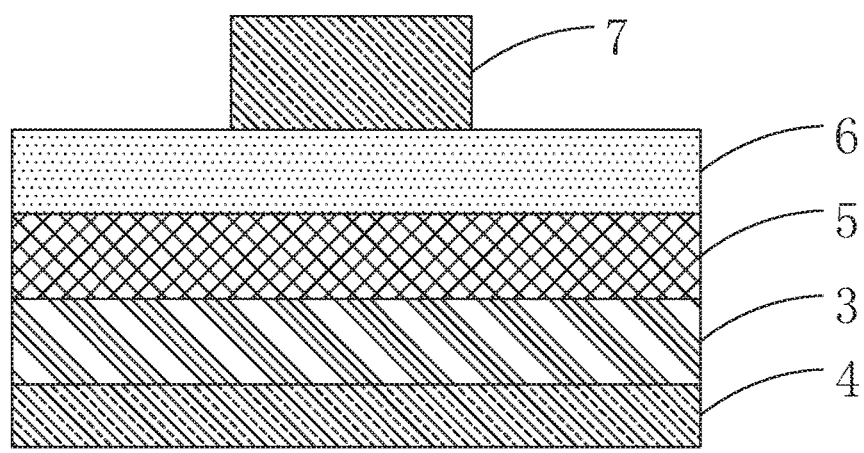
FIG. 2 is a schematic view illustrating a light-emitting diode according to a second embodiment of the present invention.

Referring to FIG. 1, in combination with FIG. 2, the present invention provides a light-emitting diode, which comprises: an emissive layer 5, an electron transportation layer 6 and a hole transportation layer 3 that are respectively set in contact with upper and lower surfaces of the emissive layer 5, a first electrode 4 set in contact with the hole transportation layer 3, and a second electrode 7 set in contact with the electron transportation layer 6. The electron transportation layer 6 is formed of a material comprising graphene.

Specifically, the first electrode 4 and the second electrode 7 are respectively an n electrode and a p electrode of the light-emitting diode and have a preferred material that is one of aluminum and copper or a combination of the two. It is apparent that the first electrode 4 and the second electrode are not limited to such a material and can be made of other suitable materials.

Preferably, the hole transportation layer 3 is formed of a material comprising an N-type doped gallium nitride, and it is apparent that the hole transportation layer 3 is not limited to such a material and can be made of other suitable materials.

It is noted that the light-emitting diode according to the present invention uses a graphene material to make the electron transportation layer 6, so as to take advantage of the excellent heat conduction property of the graphene material to fast dissipate, in a horizontal direction, heat accumulated in the emissive layer 5, in combination with slow upward spreading in a vertical direction, thereby enhance an effect of heat dissipation of the light-emitting diode, extending a service life of the light-emitting element, and also to make use of the excellent electrical conduction property of the graphene material to further improve electron transportation capability of the electron transportation layer 6 to thereby increase lighting efficiency of the light-emitting diode.

Optionally, the light-emitting diode according to the present invention has a vertical structure, or a non-vertical structure.

Specifically, as shown in FIG. 1, when the light-emitting diode is of a non-vertical structure, the first electrode 4 and the emissive layer 5 are arranged, in a manner of being spaced from each other, on the hole transportation layer 3; the electron transportation layer 6 is arranged on the emissive layer 5; and the second electrode 7 is arranged on the electron transportation layer 6.

Further, the non-vertical structure light-emitting diode further comprises a substrate 1 and a buffer layer 2, wherein the buffer layer 2 is set on and covers the substrate 1 and the hole transportation layer 3 is formed on the buffer layer 2.

Preferably, the substrate 1 is a sapphire substrate, and the buffer layer 2 is formed of a material comprising non-doped gallium nitride (GaN).

Particularly, compared to the prior art, in the non-vertical structure light-emitting diode according to the present invention the present invention, the graphene material is generally transparent and can be used to directly replace an indium tin oxide (ITO) transparent electrode that is arranged between the second electrode 7 and the electron transportation layer 6 in the prior art. In other words, the electron transportation layer 6 of the present invention that is made of the graphene material is generally an equivalent to a combination of an electron transportation layer and an ITO transparent electrode of the prior art.

Further, as shown in FIG. 2, the light-emitting diode can alternatively be a vertical structure and in this case, the first electrode 4, the hole transportation layer 3, the emissive layer 5, the electron transportation layer 6, and the second electrode 7 are sequentially stacked from bottom to top, and a sapphire substrate that has poor heat conductivity property is omitted so that heat dissipation is enhanced.

It is noted that a comparison between the vertical structure light-emitting diode and the non-vertical structure light-emitting diode provides the following facts. The non-vertical structure light-emitting diode is structured to have the first electrode 4 and the second electrode 7 generally located on the same side of the emissive layer 5 and an electrical current induced would flow not just in the vertical direction, but also in the horizontal direction for a certain distance, leading to a larger amount of heat generated, while the vertical structure light-emitting diode is structured to have the first electrode 4 and the second electrode 7 respectively located on upper and lower sides of the emissive layer 5 and an electrical current induced would flow just in the vertical direction, with no horizontal current, whereby current density is more uniform and the amount of heat generate is less, so that these, when taken in combination with the electron transportation layer 6 that is made of the graphene material, would further enhances heat dissipation and lighting efficiency of the light-emitting diode and extending service life of the light-emitting diode.

In summary, the present invention provides a light-emitting diode, which comprises: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of a material comprising graphene so that the excellent electrical conduction property and heat conduction capability of the graphene material help improve the heat dissipation capability and electron transportation capability of the light-emitting diode the electron transportation layer so as to enhance the service life and lighting efficiency of the light-emitting diode.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A light-emitting diode, comprising: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of graphene,
  wherein the light-emitting diode has a non-vertical structure in which the first electrode and the emissive layer are provided on a same surface of the hole transportation layer and spaced from each other; the electron transportation layer is arranged on the emissive layer; and the second electrode is arranged on the electron transportation layer.

2. The light-emitting diode as claimed in claim 1, wherein the electron transportation layer is arranged on the emissive layer; and the second electrode is arranged on the electron transportation layer.

3. The light-emitting diode as claimed in claim 2 further comprising: a substrate and a buffer layer;
  wherein the buffer layer is set on and covers the substrate and the hole transportation layer is formed on the buffer layer.

4. The light-emitting diode as claimed in claim 3, wherein the substrate is a sapphire substrate.

5. The light-emitting diode as claimed in claim 3, wherein the buffer layer is formed of a material comprising non-doped gallium nitride.

6. The light-emitting diode as claimed in claim 1, wherein the light-emitting diode has a vertical structure and the first electrode, the hole transportation layer, the emissive layer, the electron transportation layer, and the second electrode are sequentially stacked from bottom to top.

7. The light-emitting diode as claimed in claim 1, wherein the first electrode and the second electrode are formed of a material comprising one of aluminum and copper or a combination thereof.

8. The light-emitting diode as claimed in claim 1, wherein the hole transportation layer is formed of a material comprising doped gallium nitride.

9. A light-emitting diode, comprising: an emissive layer, an electron transportation layer and a hole transportation layer that are respectively set in contact with upper and lower surfaces of the emissive layer, a first electrode set in contact with the hole transportation layer, and a second electrode set in contact with the electron transportation layer, wherein the electron transportation layer is formed of a graphene;
  wherein the light-emitting diode has a non-vertical structure in which the first electrode and the emissive layer are provided on a same surface of the hole transportation layer and spaced from each other; the electron transportation layer is arranged on the emissive layer; and the second electrode is arranged on the electron transportation layer;
  wherein the first electrode and the second electrode are formed of a material comprising one of aluminum and copper or a combination thereof; and
  wherein the hole transportation layer is formed of a material comprising doped gallium nitride.

10. The light-emitting diode as claimed in claim 9, wherein the light-emitting diode has a vertical structure and the first electrode, the hole transportation layer, the emissive layer, the electron transportation layer, and the second electrode are sequentially stacked from bottom to top.

11. The light-emitting diode as claimed in claim 9 further comprising: a substrate and a buffer layer;
  wherein the buffer layer is set on and covers the substrate and the hole transportation layer is formed on the buffer layer.

12. The light-emitting diode as claimed in claim 11, wherein the substrate is a sapphire substrate.

13. The light-emitting diode as claimed in claim 11, wherein the buffer layer is formed of a material comprising non-doped gallium nitride.

* * * * *